(12) United States Patent
Liang et al.

(10) Patent No.: US 9,525,396 B2
(45) Date of Patent: *Dec. 20, 2016

(54) TUNABLE RESONATOR

(71) Applicants: Edward C. Liang, San Diego, CA (US); Georgiy Kolomichenko, Fort Myers, FL (US)

(72) Inventors: Edward C. Liang, San Diego, CA (US); Georgiy Kolomichenko, Fort Myers, FL (US)

(73) Assignee: MVC TECHNOLOGIES, INC., San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/842,786

(22) Filed: Sep. 1, 2015

(65) Prior Publication Data
US 2016/0191009 A1 Jun. 30, 2016

Related U.S. Application Data

(63) Continuation of application No. 13/848,699, filed on Mar. 21, 2013, now Pat. No. 9,124,236.

(51) Int. Cl.
| | |
|---|---|
| *H03H 7/01* | (2006.01) |
| *H03H 5/00* | (2006.01) |
| *H01G 5/14* | (2006.01) |
| *H01F 21/04* | (2006.01) |

(52) U.S. Cl.
CPC ............ *H03H 7/0115* (2013.01); *H01F 21/04* (2013.01); *H01G 5/14* (2013.01); *H03H 5/006* (2013.01)

(58) Field of Classification Search
CPC ....... H03H 7/01; H03H 7/0115; H03H 7/0161
USPC .................................. 333/174, 175
See application file for complete search history.

(56) References Cited

U.S. PATENT DOCUMENTS 4,361,821 A * 11/1982 Dubovsky ............... H03H 5/02
                                                333/185
9,124,236 B2 * 9/2015 Liang .................. H03H 7/0115

* cited by examiner

*Primary Examiner* — Benny Lee
*Assistant Examiner* — Albens Dieujuste
(74) *Attorney, Agent, or Firm* — Mintz Levin Cohn Ferris Glovsky and Popeo, P.C.

(57) ABSTRACT

A tunable resonator includes at least one tunable capacitor coupled with at least one tunable inductor. The tunable resonator includes a mechanical tuning mechanism coupled with a connecting bridge and with first and second electrodes of the tunable inductor. The mechanical tuning mechanism also moves the first and second electrodes of the tunable inductor relative to an electrode of the tunable capacitor, and providing a force down onto or to pull up a connecting bridge to tune the tunable inductor.

1 Claim, 5 Drawing Sheets

TUNABLE RESONATOR

CROSS REFERENCE TO RELATED APPLICATIONS

This application is a Continuation of U.S. patent application Ser. No. 13/848,699, filed Mar. 21, 2013, now U.S. Pat. No. 9,124,236, issued Sep. 1, 2015, titled, "Tunable Resonator," the disclosure of which is incorporated herein by reference.

BACKGROUND

A tunable inductor, as described herein, is preferably used in so called "lumped elements", which use discrete inductors and capacitors. Accordingly, preferred implementations of a tunable resonator include mechanically tunable resonators. In some implementations, for instance, a tunable resonator uses the lumped tunable capacitor and lumped tunable inductors described in U.S. patent application Ser. No. 13/848,682, filed Mar. 21, 2013, now U.S. Pat No. 9,048,023, issued Jun. 2, 2015 and entitled "TUNABLE CAPACITOR" and U.S. patent application Ser. No. 13/848,692, filed Mar. 21, 2013 and entitled "TUNABLE INDUCTOR," now abandoned, the contents of which are incorporated herein for all purposes.

Conventional resonators are made up of an inductor and a capacitor. They can create a series circuit or shunt circuit as shown in FIG. 1. The resonant frequency of such resonator is:

$$f_0 = \frac{1}{2\pi \cdot \sqrt{L \cdot C}}, \qquad (1)$$

where $f_0$ is a frequency of free oscillation, $L$ is inductance value of the inductor, $C$ is capacitance value of the capacitor.

The prior art of the tunable resonator uses either a tunable inductor or a tunable capacitor, but never both. As seen from formula (1), when inductance or capacitance of the resonator changes, the resonant frequency changes as well.

Certain applications of a tunable resonator, such as a tunable filter, for example, require the resonator to have a constant bandwidth even when central frequency of the filter changes. In order to keep the bandwidth constant, the resonators must be able to change their resonant frequency while keeping a characteristic impedance constant. The resonator's characteristic impedance can be expressed as:

$$Z_o = \sqrt{\frac{L}{C}}, \qquad (2)$$

Formulas (1) and (2) demonstrate that when only one parameter changes, either L or C, the central frequency changes, yet the impedance changes as well. This is a main weakness of the prior art of tunable resonators. The change of impedance results in distortion the frequency response curve and change of the bandwidth when tuned over a frequency range, as shown in FIG. 2. This limits the tunable frequency range to a narrow band where the distortion could be tolerated.

SUMMARY

This document presents a tunable inductor that resolves the above-described limitations of the prior art. In particular, a tunable resonator as described in this document excludes electrically tunable resonators, such as PIN-diode, varactors, and switched inductors resonators.

A tunable inductor, as described herein, is preferably used in so called "lumped elements", which use discrete inductors and capacitors. Accordingly, preferred implementations of a tunable resonator include mechanically tunable resonators. In some implementations, for instance, a tunable resonator uses the lumped tunable capacitor and lumped tunable inductors described in copending U.S. patent application Ser. No. 13/848,682, filed Mar. 21, 2013. and entitled "TUNABLE CAPACITOR" and U.S. patent application Ser. No. 13/848,692, filed Mar. 21, 2013. and entitled "TUNABLE INDUCTOR," the contents of which are incorporated herein for all purposes.

The tunable resonators can be adjusted or tuned to its resonant frequency by means of external control. The external control is preferably a mechanical driver powered by a stepper motor. In some instances, the stepper motor motion is controlled digitally from a computer-implemented arrangement.

In one aspect, a tunable resonator includes at least one tunable capacitor coupled with at least one tunable inductor. The tunable capacitor includes a first electrode and a second electrode, the first and second electrodes being formed of a conductive material. The tunable capacitor further includes a third electrode between the first electrode and the second electrode, and a dielectric material interposed between the first electrode and the third electrode, and between the second electrode and the third electrode. The first electrode and the second electrode are movable relative to the third electrode to adjust and tune a capacitance of the tunable capacitor. The tunable inductor includes a first wire coil having a first terminal lead, and a second wire coil having a second terminal lead that is arranged and oriented in the same direction as the first terminal lead. The tunable inductor further includes a connecting bridge connecting the first wire coil with the second wire coil opposite the first and second terminal leads, such that the first wire coil and second wire coil are arranged in series and spaced side-by-side separated by a space, the connecting bridge being movable with a force down onto or to pull up the connecting bridge, to respectively decrease the space between the first wire coil and the second wire coil to increase inductance, or increase the space between the first wire coil and the second wire coil to decrease inductance. The tunable resonator further includes a mechanical tuning mechanism coupled with the connecting bridge and with the first and second electrode, the mechanical tuning mechanism moving the first and second electrodes relative to the third electrode of the tunable capacitor, and providing the force down onto or to pull up the connecting bridge to tune the tunable inductor.

The details of one or more embodiments are set forth in the accompanying drawings and the description below. Other features and advantages will be apparent from the description and drawings, and from the claims.

BRIEF DESCRIPTION OF THE DRAWINGS

These and other aspects will now be described in detail with reference to the following drawings.

Like reference symbols in the various drawings indicate like elements.

DETAILED DESCRIPTION

This document describes a tunable resonator, and more particularly a mechanically tunable resonator having high accuracy in the designed range.

In preferred implementations, a tunable resonator is formed of a lumped inductor and a lumped capacitor. The tunable resonator has a wider tune frequency range due to simultaneous and synchronous change of both inductor value and capacitor value at the same rate, so that the ratio L/C stays constant. In other words, impedance Z stays constant. Referring again to the two formulas (1) and (2) above, in order to keep Z constant when $f_0$ changes, both L and C must be tuned simultaneously, and the values of L and C must change at the same rate as well.

Figure 1:
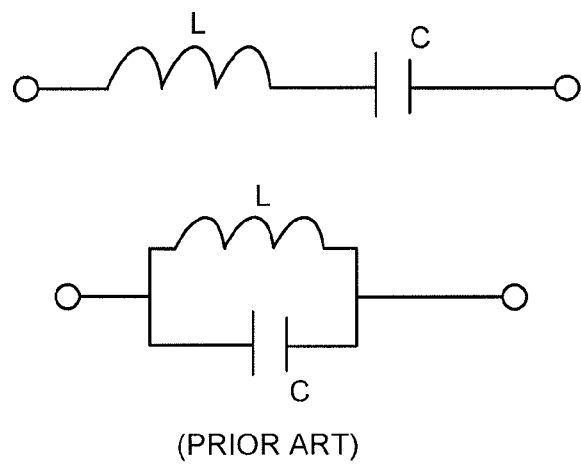
FIG. 1 illustrates a shunt circuit using a conventional resonator.
Figure 2:
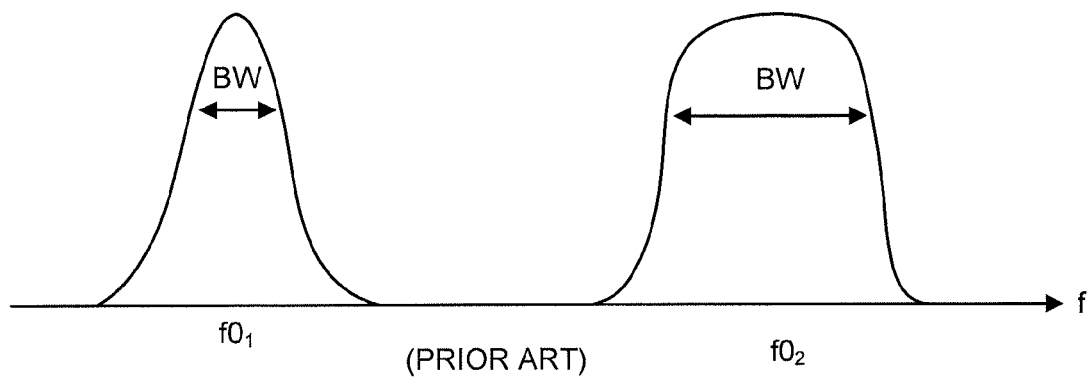
FIG. 2 illustrates a frequency range of a conventional tunable resonator.
Figure 3:
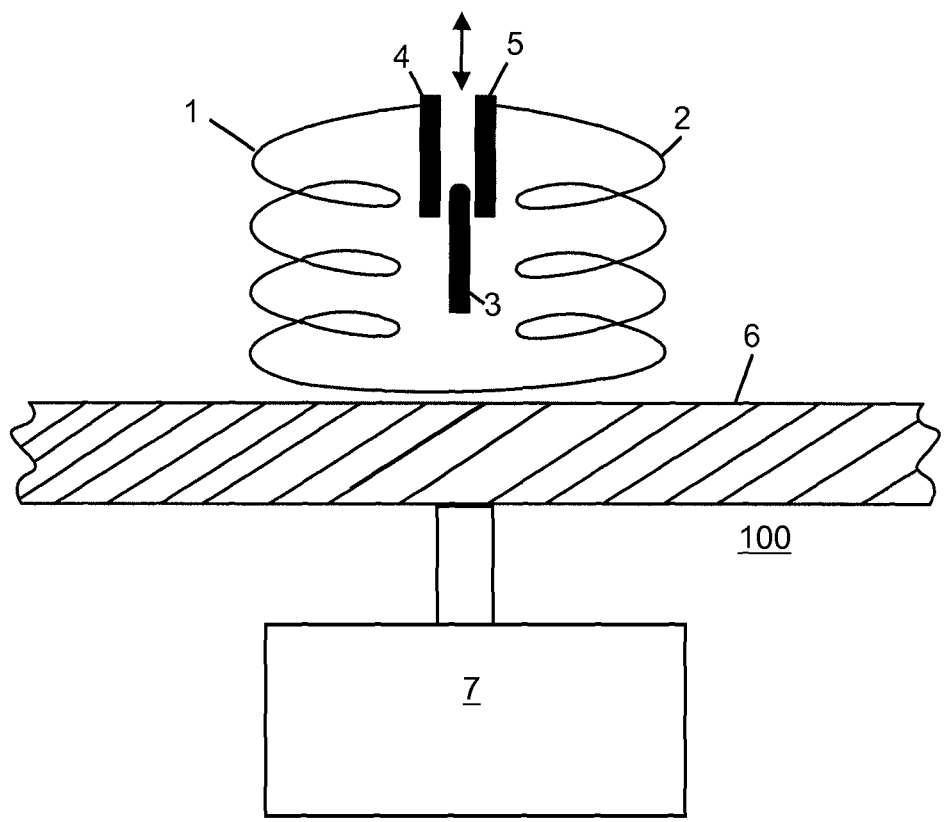
FIG. 3 illustrates a tunable resonator in accordance with implementations of the present disclosure.

FIG. 3 shows the construction of a tunable resonator 100 in accordance with some implementations. The tunable resonator 100 includes a first electrode 3, a second electrode 4, and a third electrode 5. The first electrode 3 is fixed, but the second and third electrodes 4, 5 can move up and down along with coil leads 1 and 2. When a force from a stepper-motor is exerted on the top of the tunable resonator 100, both the inductor and the capacitor change their values: the inductor squeezes (increasing the inductor value) and the capacitor electrodes overlap a greater area (increasing capacitance value as well). The dimensions of the inductor and capacitor are chosen in such manner that the rate of change inductance value and the capacitance value stay unchangeable, keeping the impedance Z constant. These result in keeping the bandwidth and frequency response curve the same when tuning over a wide frequency range. The range is theoretically unlimited and depends only on dimensions of the inductor and capacitor. Also, the tunable range increases at least two times due to changes of both L and C.

In exemplary, preferred implementations, tuning a tunable resonator includes simultaneous tuning of the inductor and capacitor with the same rate. The uniqueness is also in the specific construction of the combination consisting of the spiral tunable inductor and the sliding electrode capacitor, which produces a non-distorted frequency response with the same bandwidth over a wider frequency range.

The tunable resonator as described herein has a wider frequency range, as would a tunable filter that utilizes the tunable resonator. The tunable resonator allows for a wider frequency range in tunable filters with constant bandwidth. Other advantages include a high level of RF power, and a high quality factor Q.

Figure 4A:
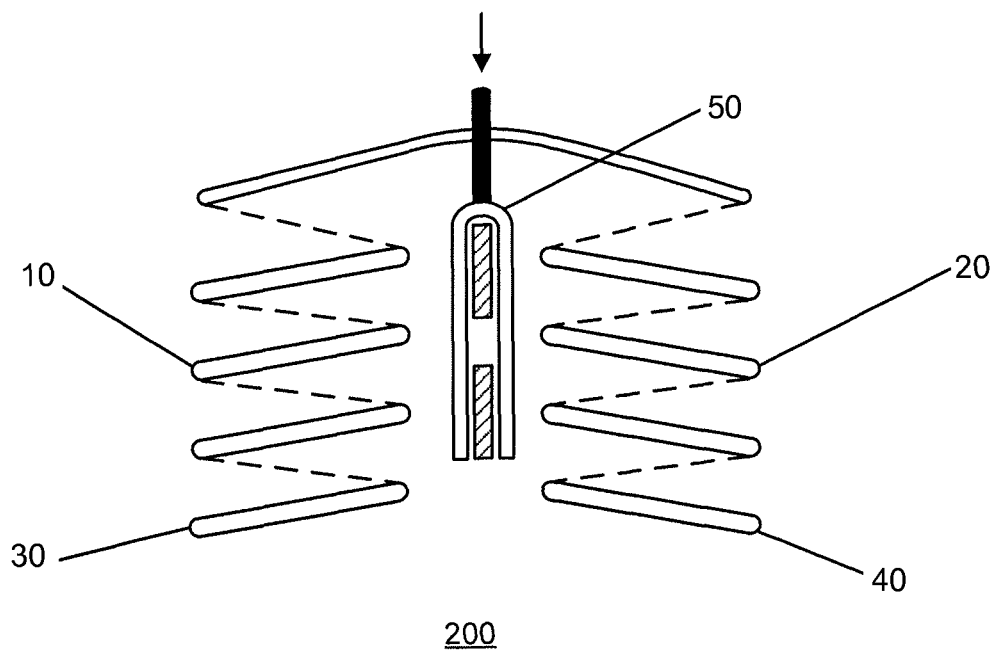
FIGS. 4A-4C illustrate various views of a tunable resonator in accordance with alternative implementations of the present disclosure.
Figure 4B:
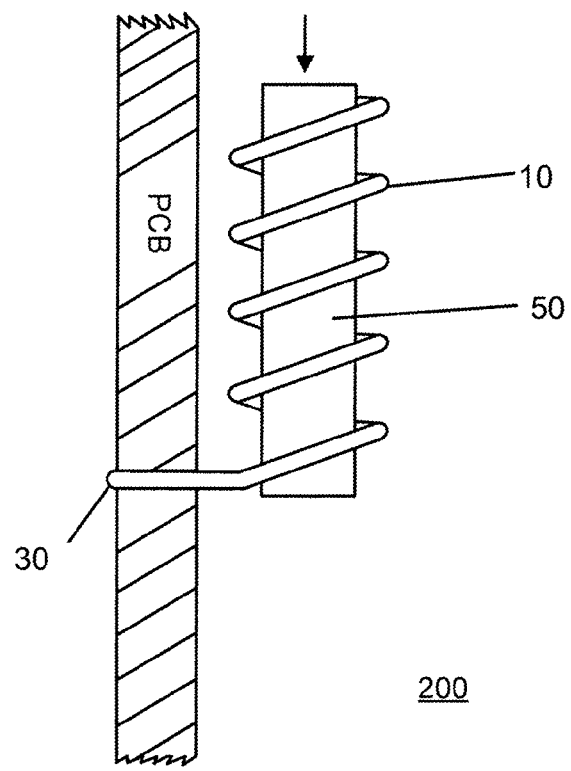
Figure 4C:
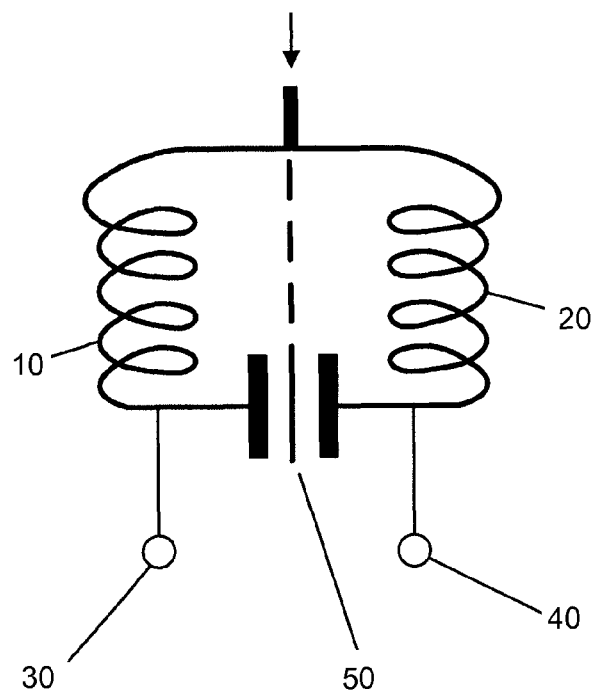

FIGS. 4A-4C illustrate various views of a tunable resonator. As shown in FIGS. 4A and 4B, the tunable resonator includes a first RF coil 10 and a second RF coil 20, a first terminal IN 30 and a second terminal OUT 40, and a tunable capacitor 50 provided between the first RF coil 10 and the second RF coil 20. The tunable capacitor 50 includes a first electrode and a second electrode, each being formed of a conductive material, and a third electrode between the first electrode and the second electrode. The tunable capacitor 50 further includes a dielectric material interposed between the first electrode and the third electrode, and between the second electrode and the third electrode. The third electrode is movable relative to the first electrode and the second electrode by a stepper motor to adjust and tune a capacitance of the tunable capacitor.

A mechanical tuning mechanism, such as the stepper motor, is coupled with a connecting bridge that connects the first and second RF coils 10, 20, and which also is coupled with an arm connecting the first and second electrodes of the tunable capacitor, as shown in FIGS. 4A and 4C. The mechanical tuning mechanism also moves the first and second electrodes relative to the third electrode of the tunable capacitor, and providing the force down onto or to pull up the connecting bridge to tune the tunable inductor.

Although a few embodiments have been described in detail above, other modifications are possible. Other embodiments may be within the scope of the following claims.

The invention claimed is:
1. A tunable resonator comprising:
   a tunable capacitor comprising:
      a first electrode and a second electrode, the first and second electrodes being formed of a conductive material;
      a third electrode between the first electrode and the second electrode; and
      a dielectric material interposed between the first electrode and the third electrode, and between the second electrode and the third electrode, the first electrode and the second electrode being movable relative to the third electrode to adjust and tune a capacitance of the tunable capacitor; and
   a tunable inductor coupled with the tunable capacitor, the tunable inductor comprising:
      a first wire coil having a first terminal lead;
      a second wire coil having a second terminal lead that is arranged and oriented in the same direction as the first terminal lead;
      a connecting bridge connecting the first wire coil with the second wire coil opposite the first and second terminal leads, such that the first wire coil and second wire coil are arranged in series and spaced side-by-side separated by a space, the connecting bridge being movable with a force down onto or to pull up the connecting bridge, to respectively decrease the space between the first wire coil and the second wire coil to increase inductance, or increase the space between the first wire coil and the second wire coil to decrease inductance; and
   a mechanical tuning mechanism coupled with the connecting bridge and with the first and second electrode, the mechanical tuning mechanism moving the first and second electrodes relative to the third electrode of the tunable capacitor, and providing the force down onto or to pull up the connecting bridge to tune the tunable inductor.

* * * * *